(12) United States Patent
Saleh et al.

(10) Patent No.: US 12,724,094 B2
(45) Date of Patent: *Sep. 1, 2026

(54) BUILT-IN COIL CURRENT SENSING FOR 1H/23NA MRI

(71) Applicant: Imam Abdulrahman Bin Faisal University, Dammam (SA)

(72) Inventors: Gameel Saleh Mohammed Saleh, Dammam (SA); Ashraf Abuelhaija, Dammam (SA)

(73) Assignee: Imam Abdulrahman Bin Faisal University, Dammam (SA)

( * ) Notice: Subject to any disclaimer, the term of this patent is extended or adjusted under 35 U.S.C. 154(b) by 322 days.

This patent is subject to a terminal disclaimer.

(21) Appl. No.: 18/610,372

(22) Filed: Mar. 20, 2024

(65) Prior Publication Data

US 2025/0298106 A1 Sep. 25, 2025

(51) Int. Cl.
*G01R 33/36* (2006.01)

(52) U.S. Cl.
CPC ..... *G01R 33/3635* (2013.01); *G01R 33/3614* (2013.01); *G01R 33/3642* (2013.01)

(58) Field of Classification Search
CPC ............... G01R 33/36; G01R 33/3607; G01R 33/3614; G01R 33/3621; G01R 33/3628; G01R 33/3635; G01R 33/3642; G01R 33/3678; G01R 33/62
See application file for complete search history.

(56) References Cited

U.S. PATENT DOCUMENTS

| | | | | |
|---|---|---|---|---|
| 4,947,121 A * | 8/1990 | Hayes | G01R 33/341 | 324/318 |
| 5,221,901 A * | 6/1993 | Decke | G01R 33/341 | 324/318 |
| 5,260,658 A * | 11/1993 | Greim | G01R 33/3628 | 324/322 |

(Continued)

OTHER PUBLICATIONS

Solbach et al. ; Near-Magnet Power Amplifier with built-in Coil Current Sensing ; Proc. Intl. Soc. Mag. Reson. Med. 22 ; 2014 ; 1 Page.

*Primary Examiner* — Steven L Yeninas
(74) *Attorney, Agent, or Firm* — Oblon, McClelland, Maier & Neustadt, L.L.P.

(57) ABSTRACT

The present disclosure relates to a current sensing system for a magnetic resonance imaging (MRI) scanner operating at 1H and 23Na resonant frequencies. The system includes a dual-tuned RF coil with a network of up to two parallel quarter-wavelength transmission lines, each integrated with a PIN diode-coupled shunt capacitor. A multiple half-wavelength transmission line is employed with a corresponding pair of shunt capacitors and PIN diodes. A quarter-wavelength transmission line, coupled with a power amplifier through a matching network of shunt capacitors and PIN diodes, is also included. The configuration parameters are designed to tune the system to the fundamental frequency and its first odd multiple, correlating with the 1H resonant frequency, and to the 23Na resonant frequency. The system accurately senses coil currents by detecting voltage variations in the matching network, thereby facilitating precise current measurements at the tuned resonant frequencies without the need for external sensors.

16 Claims, 10 Drawing Sheets

(56) References Cited

U.S. PATENT DOCUMENTS

| | | | | |
|---|---|---|---|---|
| 5,670,881 | A * | 9/1997 | Arakawa ............ | G01R 33/3628<br>324/322 |
| 9,097,769 | B2 * | 8/2015 | Schillak ................. | G01R 33/54 |
| 9,500,727 | B2 * | 11/2016 | Sohn ................ | G01R 33/34092 |
| 9,625,554 | B2 * | 4/2017 | Marek .................... | G01R 33/58 |
| 12,183,990 | B2 * | 12/2024 | Corea ................ | G01R 33/3657 |
| 2013/0134979 | A1 | 5/2013 | Mcdougall et al. | |
| 2022/0365153 | A1 | 11/2022 | Abuelhaija et al. | |
| 2025/0298105 | A1 * | 9/2025 | Saleh ........................ | H03F 3/21 |

* cited by examiner

BUILT-IN COIL CURRENT SENSING FOR 1H/23NA MRI

BACKGROUND

Technical Field

The present disclosure is directed to magnetic resonance imaging (MRI) technology, more particularly to an apparatus, system and method for built-in coil current sensing for dual-nuclei MRI imaging.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Magnetic resonance imaging (MRI) is a technology that employs nuclear magnetic resonance (NMR) phenomena to produce images of the interior of a human body. This is achieved by exciting nuclear spin species within the body with an RF pulse tuned to the resonance frequency of the nuclear spin species in question. Following the excitation, the nuclear spin species emit magnetic resonance signals as they relax back to equilibrium. These signals are then detected by the MRI system, which reconstructs them into images.

Conventionally, MRI has been utilized predominantly for imaging hydrogen nuclei (protons) within water molecules in tissue, due to the high prevalence of water in the human body. However, MRI's capability extends beyond proton imaging to include various non-proton nuclear spin species, such as helium-3 (3He), carbon-13 (13C), fluorine-19 (19F), sodium-23 (23Na), phosphorus-31 (31P), and xenon-129 (129Xe). Such non-proton species offer potential for additional diagnostic information, including metabolic and physiological insights not readily available from proton MRI.

The imaging of different nuclear spin species presents a challenge due to their distinct gyromagnetic ratios, which result in different resonance frequencies under the same magnetic field. This necessitates the use of RF coils and electronics that are tuned to the specific frequencies of the target nuclei. The traditional approach to this challenge involves either employing separate RF coils and electronics for each nuclear spin species or using RF coils capable of operating across multiple frequency bands. Both solutions have significant limitations, such as increased complexity and cost or compromised coil performance due to broad bandwidth requirements.

Furthermore, MRI systems utilize RF coils in both transmission (Tx) and reception (Rx) modes. These both coils, which may be dedicated to transmitting, receiving, or both, are opted for the resonance process and are typically designed to conform to the human body. The placement of these both coils in proximity to the target area is essential for maximizing signal detection and achieving high-quality imaging results.

There is a need to accurately control and measure the specific absorption rate (SAR) in MRI systems, particularly when imaging with radiofrequency (RF) coils which are tuned for dual nuclear spin species, such as hydrogen (1H) and sodium (23Na). Conventional methods for measuring SAR, such as pulse energy or calorimetric methods, require manual intervention and are characterized by lengthy acquisition times, which are impractical for efficient MRI operations. Additionally, the power deposition and associated heating effects necessitate precise control of the SAR for safety and image quality reasons. This control typically involves measuring the current in the transmission RF coil, which generates the rotating B1 field essential for MRI. However, conventional approaches to current measurement in RF coils are hindered by limitations, such as dependency on coil impedance, the need for integrated current sensors within the coil, and increased complexity and costs, especially in the context of multichannel, dual-tuned RF coils.

US20220365153A1 describes a transmit/receive switch of a magnetic resonance imaging (MRI) apparatus. The MRI apparatus is configured to administer two signals of different frequencies. However, the transmit/receive switch is designed with double sided microstrip line-based hybrid couplers.

US20130134979A1 describes a magnetic resonance imaging (MRI) apparatus. A tuning configuration of the MRI apparatus is based on the electrical length of the transmission lines connected to a power amplifier. However, the electrical length of the transmission lines to be an odd integer multiple of one quarter wavelength, and not a multiple of half-wavelength. The coil if the apparatus includes an array of coils.

The aforementioned references fail to disclose a technique for dual-tuned current sensing at dual resonant frequencies without the need for any integrated sensor on the coil thus resulting in significant complexity and cost to the MRI system while also the basis for a time consuming process especially for multichannel, dual-tuned RF coils.

Each of the aforementioned disclosures suffers from one or more drawbacks hindering their adoption. Accordingly, it is one object of the present disclosure to provide an efficient and cost-effective method for sensing and controlling the current in dual-tuned RF coils without the drawbacks of current techniques, thereby enhancing the functionality and performance of MRI systems.

SUMMARY

In an exemplary embodiment, current sensing system for a 1H/23Na magnetic resonance imaging (MRI) scanner is disclosed. The system includes a coil network of a dual-tuned radiofrequency (RF) coil having up to two parallel transmission lines connected to a transmission antenna of the dual-tuned radiofrequency (RF) coil and a pair of first shunt capacitors connected across the up to two parallel transmission lines. Each of the up to two parallel transmission lines have a length of quarter-wavelength. Each first shunt capacitor of the pair of first shunt capacitors is connected in series with a respective PIN diode.

The system further includes a transmission line segment. The transmission line segment includes a first transmission line having a length of a multiple of half-wavelength and a pair of second shunt capacitors connected across the first transmission line. Each second shunt capacitor of the pair of second shunt capacitors is connected in series with a respective PIN diode.

The system further includes a matching network coupled to a power amplifier, including a second transmission line having a length of a quarter-wavelength and a pair of third shunt capacitors connected across the second transmission line. Each third shunt capacitor of the pair of third shunt capacitors is connected in series with a respective PIN diode.

In one aspect, the respective length of the first transmission line and the second transmission line are configured to tune the current sensing system to a fundamental frequency and to a first odd multiple frequency of the fundamental frequency. A 1H resonant frequency is the first odd multiple frequency of the fundamental frequency. Each of the pair of first shunt capacitors, the pair of second shunt capacitors and the pair of third shunt capacitors are configured to tune the current sensing system to a 23Na resonant frequency. Each of the respective PIN diodes of the pair of first shunt capacitors, the pair of second shunt capacitors and the pair of third shunt capacitors are configured to set the current sensing system to at least one of the 1H resonant frequency and the 23Na resonant frequency. A current sensing system tuned to at least one of the 1H resonant frequency and the 23Na resonant frequency is configured to sense a current of the dual-tuned radiofrequency (RF) coil at a respective tuned resonant frequency by sensing a voltage of the matching network coupled to the power amplifier.

In another exemplary embodiment, a current sensing system for a multi-tuned magnetic resonance imaging (MRI) scanner is disclosed. The system includes a coil network of a multi-tuned radiofrequency (RF) coil. The coil network includes up to two parallel transmission lines connected to a transmission antenna of the multi-tuned radiofrequency (RF) coil and a pair of first shunt capacitors connected across the up to two parallel transmission lines. Each of the up to two parallel transmission lines have a length of quarter-wavelength. Each first shunt capacitor of the pair of first shunt capacitors is connected in series with a respective PIN diode.

The system further includes a transmission line segment including a first transmission line having a length selected from a multiple of half-wavelength and a multiple of double quarter-wavelength, and a pair of second shunt capacitors connected across the first transmission line. Each second shunt capacitor of the pair of second shunt capacitors is connected in series with a respective PIN diode.

The system further includes a matching network coupled to a power amplifier including a second transmission line having a length of a quarter-wavelength and a pair of third shunt capacitors connected across the second transmission line. wherein each third shunt capacitor of the pair of third shunt capacitors is connected in series with a respective PIN diode.

According to one aspect of the embodiment, the respective length of the first transmission line and the second transmission line in combination with each of the pair of first shunt capacitors, the pair of second shunt capacitors and the pair of third shunt capacitors are configured to tune the current sensing system to one or more resonant frequencies. Each of the respective PIN diodes of the pair of first shunt capacitors, the pair of second shunt capacitors and the pair of third shunt capacitors are configured to set the current sensing system to at least one of the one or more resonant frequencies. A current sensing system tuned to at least one of the one or more resonant frequencies is configured to sense a current of the multi-tuned radiofrequency (RF) coil at a respective tuned resonant frequency by sensing a voltage of the matching network coupled to the power amplifier.

In yet another exemplary embodiment, a method for sensing current of a radiofrequency (RF) coil of a dual-tuned magnetic resonance imaging (MRI) scanner is disclosed. The method includes connecting a coil network comprising up to two parallel transmission lines, each with a length of a quarter-wavelength to a transmission antenna of the radiofrequency (RF) coil, connecting a matching network comprising a transmission line with a length of a quarter-wavelength to a power amplifier of the magnetic resonance imaging (MRI) scanner, connecting the matching network and the coil network using a transmission line segment with a length of at least one of a multiple of half-wavelength and a multiple of double quarter-wavelength, tuning the coil network, the matching network, and the transmission line segment to a first resonant frequency of the dual-tuned magnetic resonance imaging (MRI) scanner, tuning the coil network, the matching network, and the transmission line segment to a second resonant frequency of the dual-tuned magnetic resonance imaging (MRI) scanner using three pairs of shunt capacitors with each pair of shunt capacitors connected across each of the coil network, the matching network, and the transmission line segment, setting the coil network, the matching network, and the transmission line segment to at least one of the first resonant frequency and the second resonant frequency of the dual-tuned magnetic resonance imaging (MRI) scanner using six PIN diodes, where each of the six PIN diodes is connected in series to each of the shunt capacitor of the three pairs of shunt capacitors, and sensing a current of the radiofrequency (RF) coil of the dual-tuned magnetic resonance imaging (MRI) scanner tuned to at least one of the first resonant frequency or the second resonant frequency by measuring a voltage across the matching network connected to the power amplifier.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
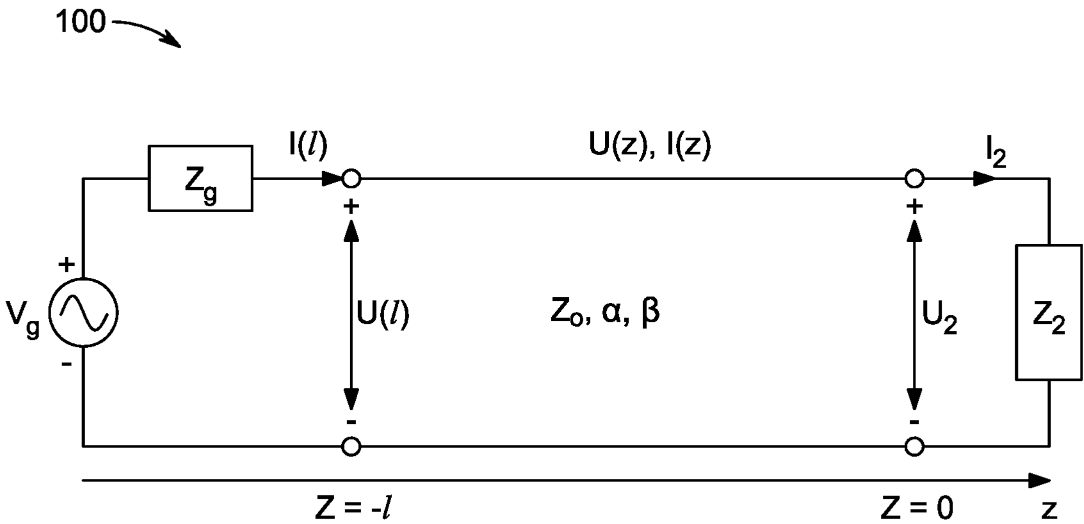
FIG. 1 illustrates a lossy transmission line pertinent to a system for built-in coil current sensing, according to certain embodiments.

In the drawings, like reference numerals designate identical or corresponding parts throughout the several views. Further, as used herein, the words "a", "an" and the like generally carry a meaning of "one or more", unless stated otherwise.

Furthermore, the terms "approximately," "approximate", "about" and similar terms generally refer to ranges that include the identified value within a margin of 20%, 10%, or preferably 5%, and any values therebetween.

Aspects of this disclosure are directed to a system, device, and method are directed to a system, device, and method for current monitoring in magnetic resonance imaging (MRI) systems, specifically for scans utilizing 1H (proton) and 23Na (Sodium) nuclei.

The current sensing system is integrated into a dual-tuned RF coil network within an MRI scanner. The RF coil network is configured with a parallel transmission lines and shunt capacitors interconnected with PIN diodes. The RF coil network is connected in series to the multiple transmission lines, where each of the multiple transmission lines are connected to a pair of shunt capacitors interconnected with PIN diodes. The components of the system and respective parameters are arranged to facilitate the tuning of the system to two different resonant frequencies, enabling the precise sensing of current by monitoring the voltage across a matching network connected to a power amplifier. The present disclosure enhances the accuracy of MRI scanning by improving current measurement accuracy, which is essential for maintaining the quality and safety of MRI diagnostics. The present disclosure enables dual-frequency operation without the need for additional sensors, thus simplifying the MRI system's design and potentially reducing costs. By tuning to the specific resonant frequencies of 1H and 23Na, the system can perform targeted imaging for a comprehensive diagnostic analysis.

Figure 3:
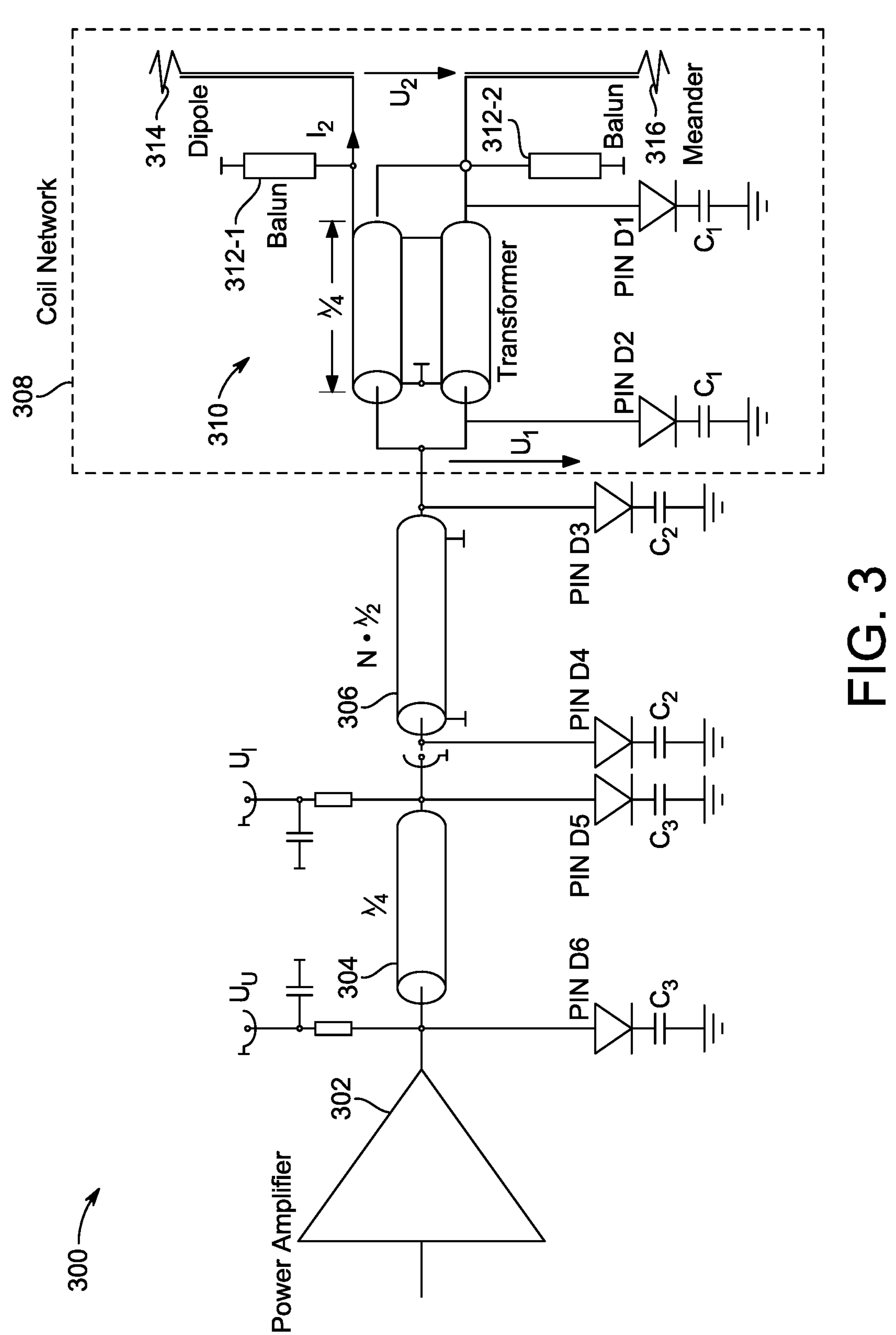
FIG. 3 illustrates a circuit diagram depicting a near-magnet power amplifier 302 with built-in coil current sensing, according to certain embodiments.

FIG. 1 illustrates a lossy transmission line 100 characterized by its voltage and current definitions pertinent to a system for built-in coil current sensing, in accordance with one embodiment. The system, shown in FIG. 3, is tailored for Magnetic Resonance Imaging (MRI) at 1H and 23Na resonant frequencies. The depiction presents a voltage source Vg with an internal impedance Zg, initiating a current I(z) along the transmission line. The transmission line 100 is characterized by a propagation constant $\gamma$ comprising an attenuation constant $\alpha$ and a phase constant $\beta$, along with a characteristic impedance Zo.

The voltage wave U(z) is represented along the transmission linen 100 at two points: z=–l and z=0, where l is the length of the transmission line. At the load end of the transmission line, where z=0, the load impedance Z2 is encountered, and the corresponding load current I2 and voltage U2 are indicated.

The current forcing property is derived from the voltage wave U(z) that is shown in FIG. 1. The voltage wave for lossless transmission line at z=1 can be expressed as:

$$U(z=-l)=I_2[Z_2\cos(\beta l)+jZ_o\sin(\beta l)] \tag{1}$$

where, $Z_2$ is the load impedance, $I_2$ is the load current, $Z_o$ is the characteristic impedance of the transmission line, $\beta$ is the phase constant and 1 is the length of the transmission line.

Once a transmission line with quarter-wavelength is used, Eq. 1 becomes:

$$U(l=\lambda/4)=jI_2Z_o \tag{2}$$

After rearranging Eq. 2:

$$I_2=\frac{U\left(l=\frac{\lambda}{4}\right)}{Z_0}\angle-90^\circ \tag{3}$$

Eq. 3 represents the current forcing property which shows the proportionality between the load current and the input voltage of the quarter wave transmission line.

Since, real transmission lines are lossy, Eq. 1 becomes:

$$U(z=-l)=I_2Z_2[\cos(j\alpha l)\cos(\beta l)+\sin(j\alpha l)\sin(\beta l)]-jI_2Z_o[\sin(j\alpha l)\cos(\beta l)-\cos(j\alpha l)\sin(\beta l)] \tag{4}$$

Once a transmission line with quarter-wavelength is used, Eq. 4 becomes:

$$U(l=\lambda/4)=I_2Z_2\sin(j\alpha l)+jI_2Z_o\cos(j\alpha l). \tag{5}$$

After rearranging Eq. (5), following equation is derived:

$$I_2=\frac{U\left(l=\frac{\lambda}{4}\right)}{Z_2\sin(j\alpha l)+jZ_o\cos(j\alpha l)}. \tag{6}$$

Equation (1) describes the voltage wave at the location z=–l, incorporating the load impedance Z2, the characteristic impedance Zo, and the phase constant $\beta$. The equation illustrates the relationship between the voltage wave and the current at the specified location on the lossy transmission line.

The transmission line model depicted in FIG. 1 is integral to the operation of the built-in coil current sensing mechanism, as it defines the electrical environment in which the current forcing property, essential to the disclosed MRI system, is observed and utilized.

Figure 2:
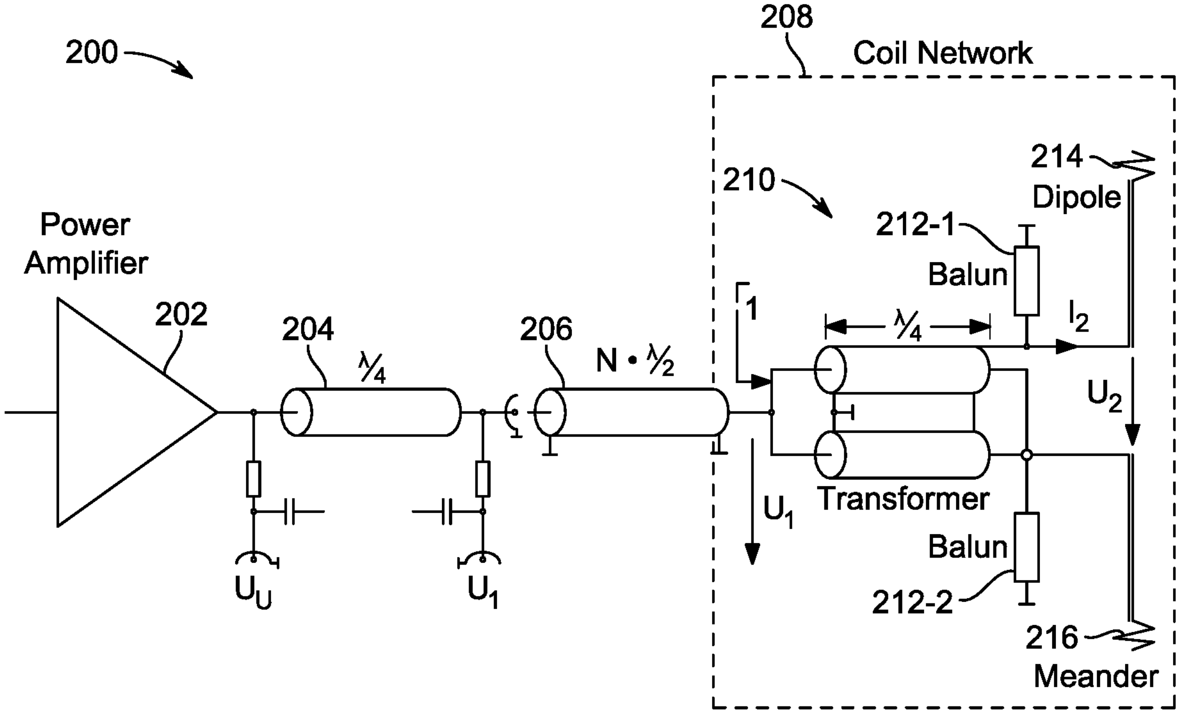
FIG. 2 illustrates a circuit diagram of an MRI system with a near-magnet power amplifier, according to certain embodiments.

FIG. 2 illustrates a circuit diagram of an MRI system 200 with a near-magnet power amplifier 202 configuration having integrated coil 208 current sensing, in accordance with one embodiment. The MRI system 200 is designed for use in MRI at dual frequencies. In one aspect, it resonates at the 1H and 23Na resonant frequencies. The system 200 mainly includes, but may not be limited to, a power amplifier 202 connected to a radiofrequency (RF) coil 208 through a transmission line.

The power amplifier 202 is configured as a source of radiofrequency (RF) energy for the MRI system 200. The power amplifier 202 amplifies low-power RF signals to higher power levels suitable for MRI operations. The power amplifier 202 provides the precise radio frequencies relevant to MRI, including those for 1H and 23Na imaging, ensuring the magnetization of nuclei within the subject.

The output of the power amplifier 202 is connected to two probes, denoted as $U_U$ and $U_I$, across a quarter-wave transmission line. The $U_U$ and $U_I$ probes are implemented as connectors and sensors that sample the output voltage from the power amplifier 202. Probe $U_U$ is designed to monitor the voltage level directly, while probe $U_I$ provides a means to observe any changes in the impedance environment, thereby facilitating real-time adjustments to the power levels necessary for MRI imaging.

The transmission line in the system 200 is configured as the conduit through which the RF signals travel from the power amplifier 202 to the RF coil 208, ensuring minimal signal loss and maintaining signal integrity.

In one implementation, the power amplifier 202 is coupled to the RF coil 208 through multiple transmission lines. In one aspect, the quarter-wave transmission line ($\lambda/4$) 204 is followed by a multiple of half-wavelength transmission line ($N\times\lambda/2$) 206, connecting the power amplifier 202 to the RF coil 208. The half-wavelength transmission line 206 is implemented to enforce the current forcing property as applicable, where the current delivered to the load, for example, the RF coil 208, is dictated by the input voltage and is independent of the coil 208's impedance. The half-wavelength transmission line 206 ensures that the current I2 in the RF coil 208 is directly proportional to the voltage $U_I$ from the power amplifier 202, maintaining consistent RF energy delivery to the coil 208 for accurate MRI imaging. The quarter wavelength transmission line $\lambda/4$ 204 are configured to maintain the integrity of the RF signal over the distance it travels, preventing significant phase shifts or power losses that could affect the imaging process.

The meander printed dipole RF coil 208, referred to as the RF coil 208 hereinafter, is configured to utilize a plurality of parallel quarter-wave transmission lines 210. In accordance with the embodiment, two parallel quarter-wave transmission lines 210 are configured as a matching network in the RF coil 208. The matching network of the two parallel quarter-wave transmission lines 210 is configured for adapting the RF coil 208 input impedance of 10Ω to match the standard 50Ω impedance of the transmission line. Such matching of the RF coil 208 input impedance to the standard impedance of the transmission lines 210 renders efficient transfer of RF energy from the power amplifier 202 to the RF coil 208 minimizing reflections that could degrade signal quality.

The RF coil 208 configuration includes a pair of baluns, 212-1 and 212-2, connected across the two parallel quarter-wave transmission lines 210. The balun is a device that uses voltage currents to create balanced lines between an antenna system and a cable system.

The RF coil 208 configuration integrates a dipole antenna 214 and a meander element 216. The dipole antenna 214 refers to a type of antenna that is formed by two conductive elements (poles) arranged in a straight line. In MRI coils, the dipole antenna 214 is used to transmit and receive RF signals. The dipole antenna 214 is typically resonant at the frequency of interest, which would be the Larmor frequency for the nuclei being imaged (1H, 23Na, etc.). The dipole antenna 214 in an MRI system is configured for creating the B1 field that excites the spins within the body and for receiving the resulting RF signal that is used to create the image.

The meander element 216 is the conductive elements where a serpentine path is followed for the conductance. The meander pattern is used to fit a larger length of conductor into a smaller space, which can help to increase the inductance of the coil without increasing its size. The meandering structure can also influence the uniformity of the RF field and the coil's sensitivity.

The RF coil 208 is optimized for dual-tuned operations, capable of handling the specific Larmor frequencies associated with both 1H and 23Na nuclei. The dual-tuned capability allows for simultaneous or sequential imaging at the frequencies associated with both 1H and 23Na nuclei, providing versatility for various imaging protocols without the need to switch coil 208 or reconfigure the system 200.

The design depicted in FIG. 2 is intended to support the operation of the MRI system 200 at high magnetic fields, such as 7 Tesla or above, where accurate and controlled RF signal transmission and current sensing are critical for producing high-quality MRI images.

FIG. 3 illustrates a circuit diagram demonstrates a near-magnet power amplifier 302 with built-in coil current sensing, in accordance with one embodiment. The near-magnet amplifier is configured for use in a 1H/23Na magnetic resonance imaging (MRI) scanner system 300, referred as to MRI system 300. The MRI system 300 is designed to sense the coil current at two different atomic nuclei resonant frequencies. In an embodiment, the resonant frequencies are set at 298 MHz for 1H and 78.8 MHz for 23Na.

The MRI system 300 comprises a coil network 308 of a dual-tuned radiofrequency (RF) coil. In one aspect, the coil network 308 includes up to two parallel transmission lines connected to the transmission antenna of the RF coil. Each of the up to two parallel transmission lines is of a quarter-wavelength in length.

In the coil network 308, a pair of first shunt capacitors is connected across the parallel transmission lines and in series with a respective PIN diode. As shown in FIG. 3, first of the first shunt capacitors C1 is connected in series with PIN D1 across the parallel transmission lines, and second of the first shunt capacitors C1 is connected in series with PIN D2 across the parallel transmission lines. The pair of first shunt capacitors are used to adjust the resonant frequency of the RF coil. By adding capacitors in parallel to the coil, the overall capacitance increases, which lowers the resonant frequency. In a dual-tuned coil, different capacitance values are needed to tune the coil to resonate at the two distinct Larmor frequencies of different nuclei, such as 1H and 23Na. In a non-limiting example, C1 is 27.2 pF.

The coil network 308, as described with reference to FIG. 2, includes a pair of baluns, 312-1 and 312-2, and a dipole antenna 314 and a meander element 316.

In accordance with the embodiment, the system 300 includes a transmission line segment. The transmission line segment consists of a plurality of transmission lines, each having a length of a multiple of double quarter-wavelength. The plurality of transmission lines includes a first transmission line 306 of a multiple half-wavelength length and a pair of second shunt capacitors C2 are connected across this first transmission line 306, again in series with respective PIN diodes. As shown in FIG. 3, a first of the pair of second shunt capacitor C2 is connected to PIN D3 in series, and a second of the pair of second shunt capacitor C2 is connected to PIN D4 in series. In a non-limiting example, C2 is 24.9 pF. The transmission line segment facilitates the tuning of the system 300 to the fundamental frequency and its first odd multiple, which corresponds to the 1H resonant frequency.

The system 300 further includes a matching network, which is coupled to the power amplifier. The matching network includes a second transmission line 304 of a quarter-wavelength and a pair of third shunt capacitors connected across the second transmission line 304, each in series with a respective PIN diode. In an example, as shown in FIG. 3, a first of the pair of third shunt capacitor C3 is connected to PIN D5 in series, and a second of the pair of third shunt capacitor C3 is connected to PIN D6 in series. In a non-limiting example, C3 is 13.66 pF. The specific lengths of the first transmission line 306 and the second transmission line 304 are calculated to tune the system 300 to both the fundamental frequency and the 1H resonant frequency. In one implementation, the fundamental frequency is 99.33 MHz.

In one aspect, the shunt capacitors are selected to tune the system 300 to the 23Na resonant frequency. The PIN diodes are utilized to select between the two resonant frequencies, 298 MHz or 78.8 MHz, ensuring the system 300's ability to operate at either resonant frequency.

The current MRI system 300 is specifically configured to sense the current of the dual-tuned RF coil at the tuned resonant frequency by sensing the voltage of the matching network that is coupled to the power amplifier. Such configuration results in an efficient current sensing mechanism without the need for an integrated sensor on the coil, which simplifies the overall system 300 and potentially reduces costs. The system 300's ability to sense coil current at the resonant frequencies of different atomic nuclei is essential for the advanced functionality of dual- or multi-tuned RF coils in MRI imaging.

In one aspect, the transmission line segment is configured to apply a current forcing technique to the current sensing system.

In one aspect, the power amplifier 302 is configured to apply a cartesian feedback loop (FBL). A Cartesian Feedback Loop is a type of feedback control system that compares the real (I, or in-phase) and imaginary (Q, or quadrature) components of the output signal with the input signal. The components are the Cartesian coordinates of the signal in the complex plane. The FBL operates by down-converting the amplified output signal back to baseband where it is then compared with the original input baseband signal. Any discrepancies between the output and input signal in terms of amplitude or phase are used to generate error signals.

These error signals are then processed and fed back to the power amplifier's input in a way that counteracts the distortion, reducing non-linearities and improving the linearity of the amplifier. By doing so, the FBL helps to maintain the fidelity of the transmitted signal, ensuring that it closely matches the desired input signal despite the amplifier's non-linear characteristics.

In an MRI system, the precision and stability of the RF signals are critical, as they directly impact the quality of the imaging. The FBL ensures that the RF signals used to excite the atomic nuclei in the body are accurate, stable, and free from distortions that could degrade the image quality.

In an alternate embodiment, a method for sensing current of a radiofrequency (RF) coil of a dual-tuned magnetic resonance imaging (MRI) scanner is disclosed. The method is implemented by the system 300 illustrated by FIG. 3.

The method includes connecting a coil network comprising up to two parallel transmission lines, each with a length of a quarter-wavelength to a transmission antenna of the radiofrequency (RF) coil, connecting a matching network comprising a transmission line with a length of a quarter-wavelength to a power amplifier of the magnetic resonance imaging (MRI) scanner, connecting the matching network and the coil network using a transmission line segment with a length of at least one of a multiple of half-wavelength and a multiple of double quarter-wavelength, tuning the coil network, the matching network, and the transmission line segment to a first resonant frequency of the dual-tuned magnetic resonance imaging (MRI) scanner, tuning the coil network, the matching network, and the transmission line segment to a second resonant frequency of the dual-tuned magnetic resonance imaging (MRI) scanner using three pairs of shunt capacitors with each pair of shunt capacitors connected across each of the coil network, the matching network, and the transmission line segment, setting the coil network, the matching network, and the transmission line segment to at least one of the first resonant frequency and the second resonant frequency of the dual-tuned magnetic resonance imaging (MRI) scanner using six PIN diodes, where each of the six PIN diodes is connected in series to each of the shunt capacitor of the three pairs of shunt capacitors, and sensing a current of the radiofrequency (RF) coil of the dual-tuned magnetic resonance imaging (MRI) scanner tuned to at least one of the first resonant frequency or the second resonant frequency by measuring a voltage across the matching network connected to the power amplifier.

Figure 4:
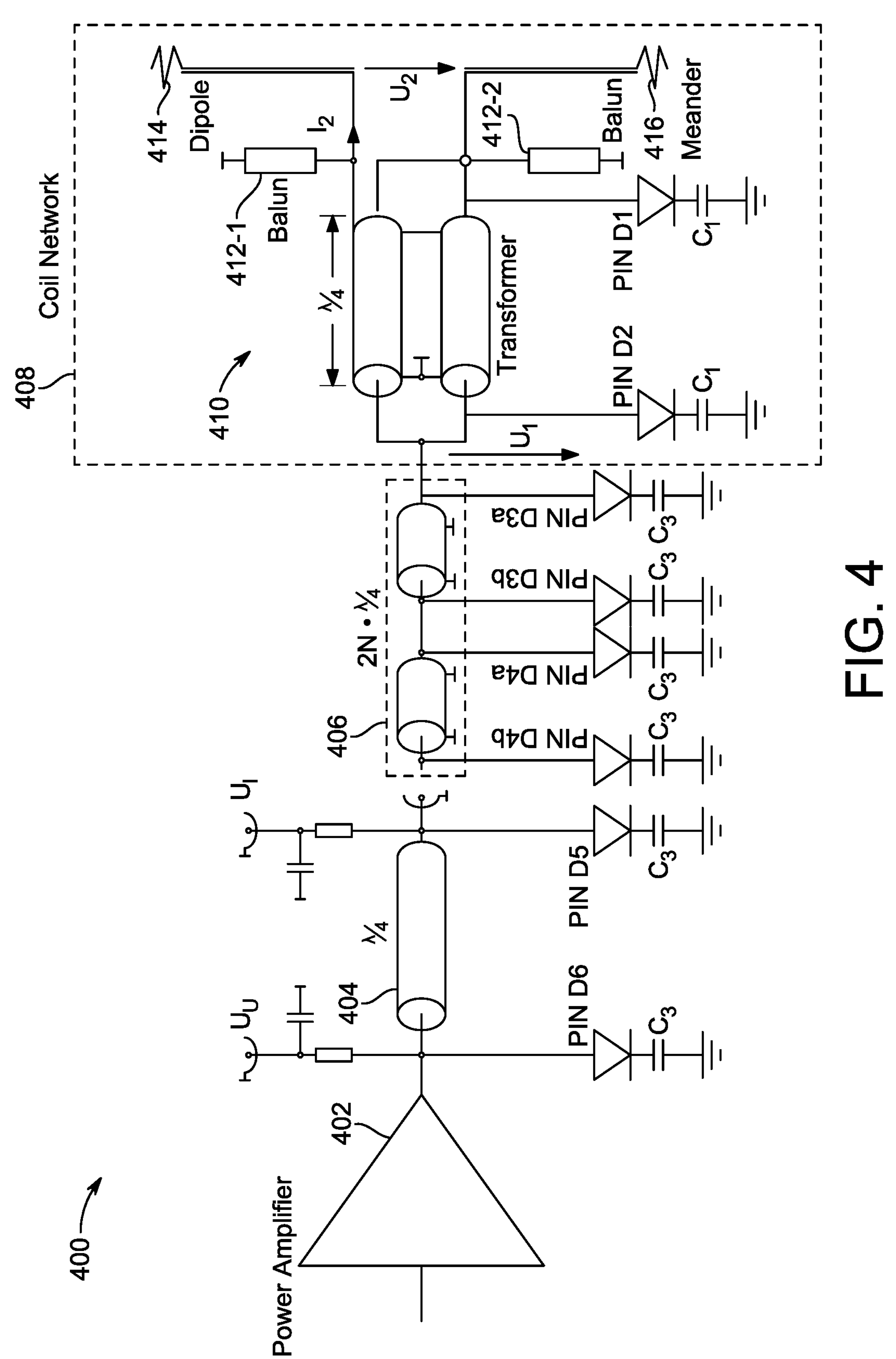
FIG. 4 illustrates the circuit diagram of an enhanced configuration of an MRI system with a near-magnet power amplifier with built-in coil current sensing, according to certain embodiments.

The system 300 employs a transmission line cable that is a multiple of the half-wavelength (N×λ/2) in conjunction with two shunt capacitors. The selection of this transmission line's length is critical to ensure that the voltage at the termination point, proximal to the power amplifier 302, is equivalent to that at the originating end. However, the configuration illustrated in FIG. 3 inherently diminishes the impedance matching capability and augments the insertion loss within the system 300. To overcome these drawbacks, the original multiple half-wavelength (N×λ/2) transmission line has been replaced by a composite of multiple double quarter-wavelength (2N×λ/4) transmission lines, as illustrated in FIG. 4. The configuration illustrated by FIG. 4 is configured to optimize the performance of the transmission line by enhancing impedance matching and reducing insertion loss.

FIG. 4 illustrates the circuit diagram of an enhanced configuration of an MRI system 400 with a near-magnet power amplifier with built-in coil current sensing, in accordance with one embodiment. The system 400 is configured for sensing coil current at two distinct atomic nuclei resonant frequencies, indicated as X-nuclei frequencies, in one implementation of the embodiment. The system 400 includes multiple double quarter-wavelength (2N×λ/4) transmission lines 404, which supplant the previously employed multiple half-wavelength (N×λ/2) transmission line cables 406. The System 400 includes a coil network 408 that is substantially similar to the coil network 308. The coil network 408 includes a pair of first shunt capacitors C1 and C2 connected across the parallel transmission lines and in series with a respective PIN diode (D1 and D2). The pair of first shunt capacitors, C1 and C2, are used to adjust the resonant frequency of the RF coil. By adding capacitors in parallel to the coil, the overall capacitance increases, which lowers the resonant frequency. In a dual-tuned coil, different capacitance values are needed to tune the coil to resonate at the two distinct Larmor frequencies of different nuclei, such as 1H and 23Na. In a non-limiting example, C1 is 27.2 pF. The coil network 408, as described, includes a pair of baluns, 412-1 and 412-2, a dipole antenna 414, and a meander element 416.

The implementation of double quarter-wavelength transmission lines 406 results in mitigating the inherent voltage value discrepancies attributed to the transmission line losses over extended distances. The double quarter-wavelength transmission lines 406 maintain the voltage values across lengthy distances from the power amplifier to the RF coil 408, despite the inherent losses associated with cable transmission. The multiple quarter-wavelength segments are precisely structured to counteract the impedance matching challenges and heightened insertion losses presented by the half-wavelength transmission line configuration 404.

In the system 400, the transmission lines are meticulously configured to ensure that the voltage at the load end (U2) corresponds accurately to the input voltage (U1) from the power amplifier, taking into consideration the attenuation factor (α) of the transmission lines. This correlation is critical for maintaining the current forcing property that is foundational to the coil current sensing mechanism.

It is understood that due to the several distance meters between the power amplifier and the RF coil 408, the accuracy of current forcing property-based coil current sensing will be affected by the intermediate connected cables (N×λ/2 or 2N×λ/4) because these cables are lossy.

For losses transmission line, the relationship between the load voltage $U_2$ and the input voltage $U_1$ shown in FIG. 1 at the half-wave transmission line 404 terminals is:

$$U_2 = \pm U(l = N \cdot \lambda/2) \tag{7}$$

For lossy transmission line, this relationship becomes:

$$U_2 = \frac{-Z_2 U\left(l = N\frac{\lambda}{4}\right)}{Z_\alpha \sinh(\alpha l) + Z_2 \cosh(\alpha l)}. \tag{8}$$

Eq. 8 shows that the load voltage $U_2$ is dependent on the attenuation factor of the transmission line (α).

The circuit employs RG223 coaxial cable as a transmission line. The transmission line is characterized by a 50 Ohm impedance, an inner conductor diameter of 0.88 mm, a dielectric diameter of 2.95 mm, and an attenuation factor of 0.23 dB/m at 298 MHz. These parameters are vital to achieving precise and reliable current sensing in the dual resonant 1H/23Na RF coil 408.

Figure 5:
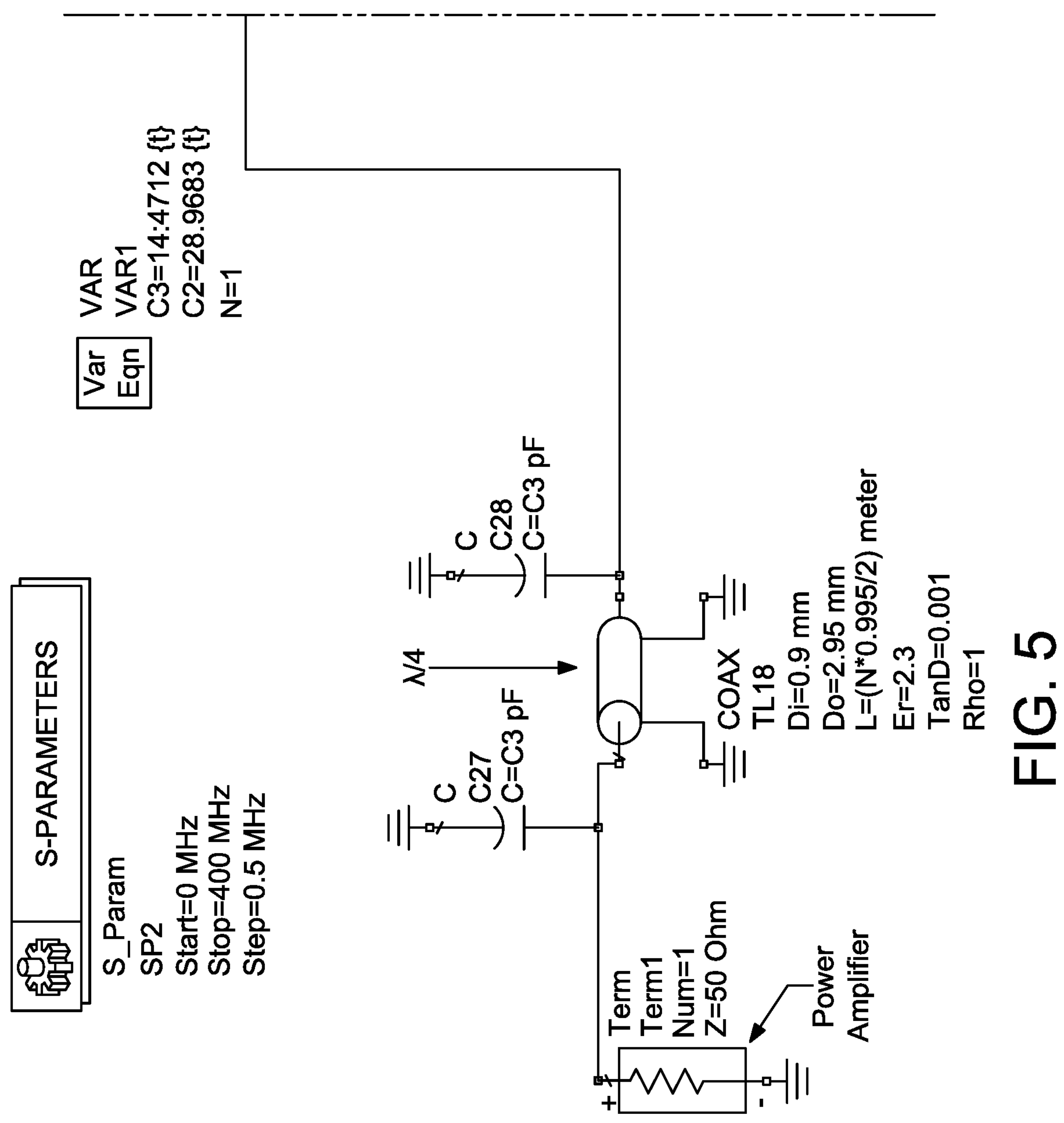
FIG. 5 illustrates a detailed simulation setup for the current sensing system, according to certain embodiments.
Figure 5:
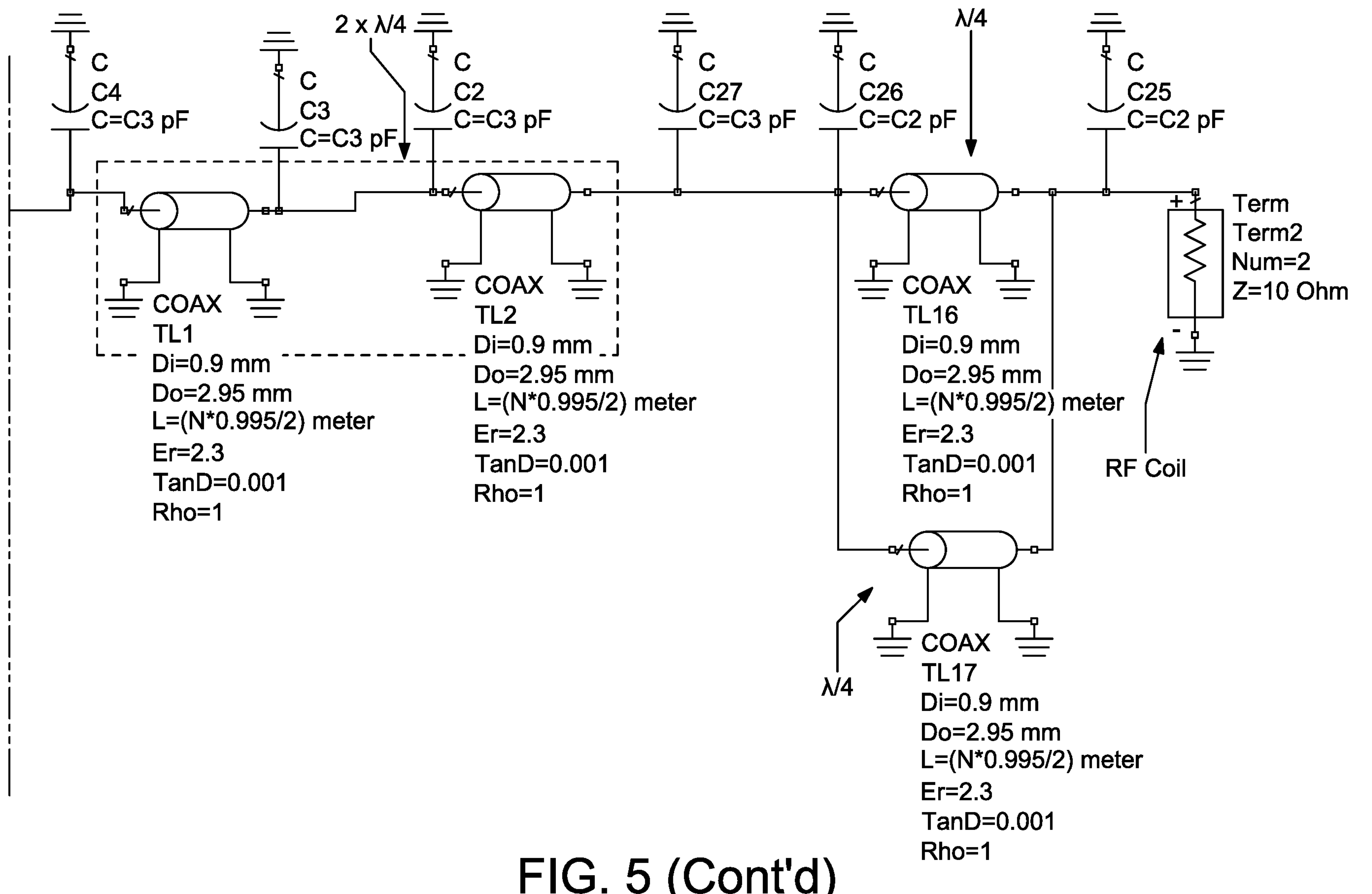

FIG. 5 illustrates a detailed simulation setup for the current sensing system 500, in accordance with one embodiment. The system 500 is configured to function at the resonant frequencies of 1H/23Na atomic nuclei, utilizing multiple double quarter-wavelength (2N×λ/4) transmission lines (506, 508). The simulation is designed to ascertain the current flow within the RF coil of a magnetic resonance imaging (MRI) scanner.

The simulation set-up depicts a near-magnet power amplifier 502, transmission lines (504, 506, 508, 510, 512), and a Radiofrequency (RF) coil 514. The power amplifier 502 is coupled to the transmission lines for propagating through the transmission lines. The transmission lines are calibrated at specific lengths. In one implementation, the transmission lines are calibrated at lengths of λ/4 504 and 2λ/4 (506, 508) to align with the resonant frequencies required for 1H and 23Na imaging. The shunt capacitors, denoted as C1, C2, and C3, are positioned along the transmission lines and are configured for tuning the system's response to the intended frequencies.

In one aspect, PIN diodes serve as switches to alternate between the 1H and 23Na frequency modes, providing the dual-tuned functionality. The simulation setup also includes a depiction of the measurement nodes, where the relevant S-parameters are evaluated to confirm the proper functioning of the system.

The simulation setup allows for the virtual assessment of the circuit's performance before physical implementation. The simulation setup offers a visual and quantitative analysis of how the current flows through the RF coil 514 when exposed to the RF signal from the power amplifier 502, and how effectively the system can sense and adapt to the different frequencies necessary for dual-nuclei MRI applications. The simulation's accuracy is fundamental to ensuring that the system will operate as intended in a real-world scenario, providing accurate, reliable, and cost-effective current sensing for the MRI scanner.

Figure 6:
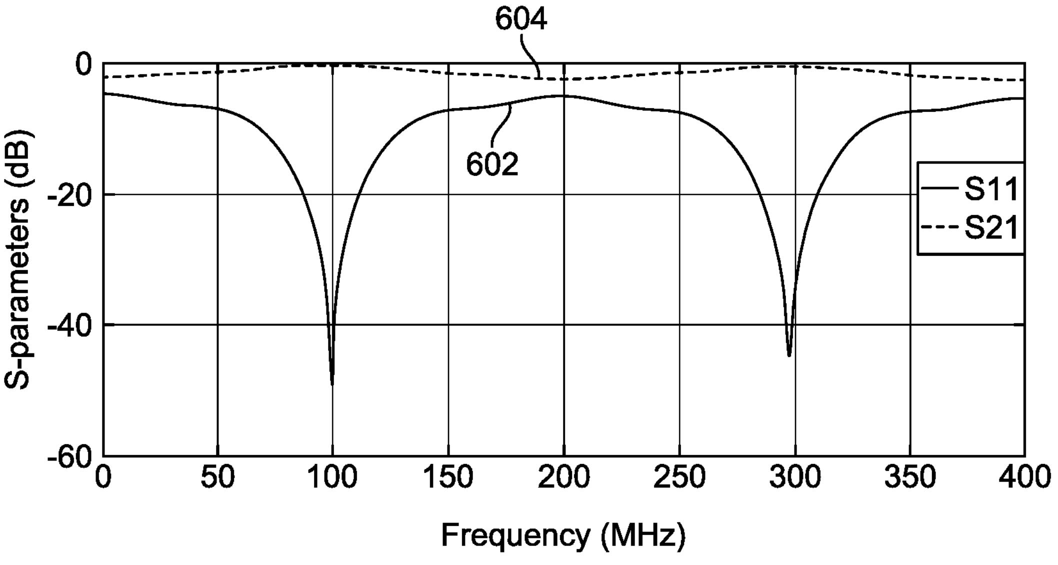
FIG. 6 presents the S-parameter analysis for the hydrogen (1H) atomic nuclei resonant frequency at 298 MHz, according to certain embodiments.

FIG. 6 presents the S-parameter analysis for the hydrogen (1H) atomic nuclei resonant frequency at 298 MHz, in accordance with one embodiment. The S-parameter analysis is related to system where the transmission lines' electrical lengths are set at a quarter-wavelength (λ/4) and a half-wavelength (λ/2) at the fundamental frequency of 99.33 MHz. The graph delineates two curves, S11 602 representing the return loss and S21 representing the insertion loss across the frequency spectrum. The simulation results of the simulation set-up illustrated in FIG. 6 exhibit excellent matching at the 1H resonant frequency, as indicated by an S11 value of −44.8 dB, implying minimal reflection and a well-tuned system. The low insertion loss marked by an S21 604 value of −0.49 dB denotes efficient signal transmission through the circuit at the specified frequency of 298 MHz.

Figure 7:
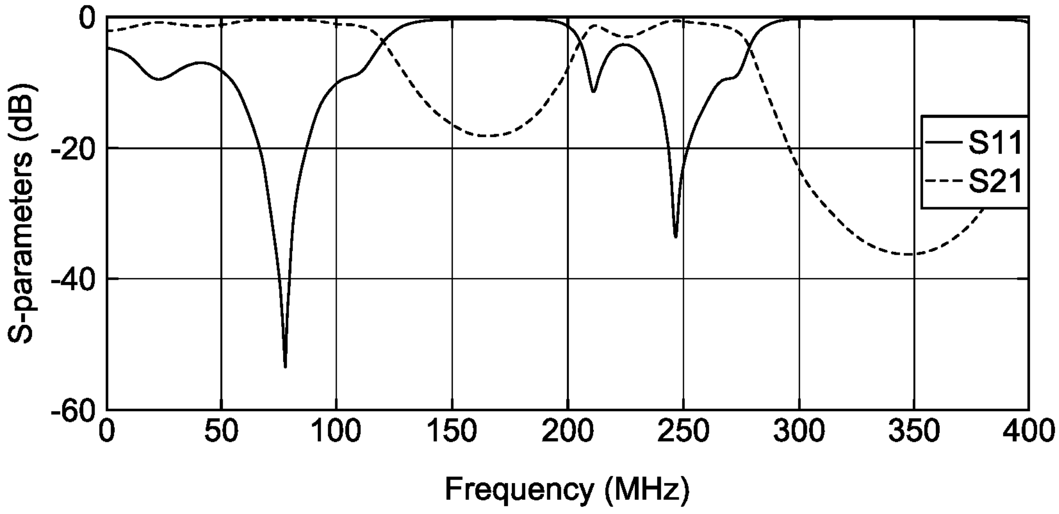
FIG. 7 illustrates the S-parameter analysis for the sodium (23Na) atomic nuclei resonant frequency at 78.8 MHz, according to certain embodiments.

FIG. 7 illustrates the S-parameter analysis for the sodium (23Na) atomic nuclei resonant frequency at 78.8 MHz, in accordance with one embodiment. In the simulation setup, employing the circuit configuration as described for FIG. 6, the transmission lines are again designed at the fundamental frequency of 99.33 MHz. The figure shows that, upon activation of the shunt PIN diodes and appropriate adjustment of the capacitors to values of C1=28.9 pF and C3=14.47 pF, the circuit achieves a strong match at the 23Na resonant frequency, evidenced by an S11 702 value of −54.64 dB. This indicates that the reflections are exceptionally low, signifying an optimal resonance at the 23Na frequency. Additionally, an S21 704 value of −0.292 dB highlights that the circuit maintains a very low insertion loss at 78.8 MHz, confirming the efficiency of signal propagation at this frequency.

It is understood that the accuracy of the built-in coil current sensing mechanism, which relies on the principle of current forcing, depends upon the precise configuration of the connecting cables. The electrical lengths of the transmission cables are calibrated to correspond with the operational frequency of the system. Moreover, the precision with which the coil current is sensed is susceptible to variations based on the length of the cables connecting intermediate components, specifically those measured as multiples of half-wavelength (N×λ/2) or double quarter-wavelength (2N×λ/4).

Implementing a power amplifier in proximity to the magnet, commonly referred to as a near-magnet power amplifier, can effectively diminish the requisite cable length to approximately 3 or 4 meters. For lossless cable, the voltages at both ends of the half-wave cable are equal with 180 phase shifts. Whereas, for lossy cable, the unity voltage ratio starts to decrease as a function of cable length.

In practical applications where a 4-meter cable has been installed, the accuracy of the current sensing at a frequency of 298 MHz is estimated to deteriorate to approximately 90%, and to about 94.4% at a frequency of 78.8 MHz. The current design paradigm holds significant promise for the monitoring of currents in multi-channel, dual-resonant RF coils within MRI systems. This is mainly due to its potential to obviate the necessity for additional integrated sensors, thereby streamlining the system's architecture and enhancing its overall efficiency.

Figure 8A:
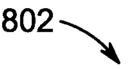
FIG. 8*a* depicts a power amplifier 802 setup used to validate the built-in coil current sensing methodology, according to certain embodiments.
Figure 8A:
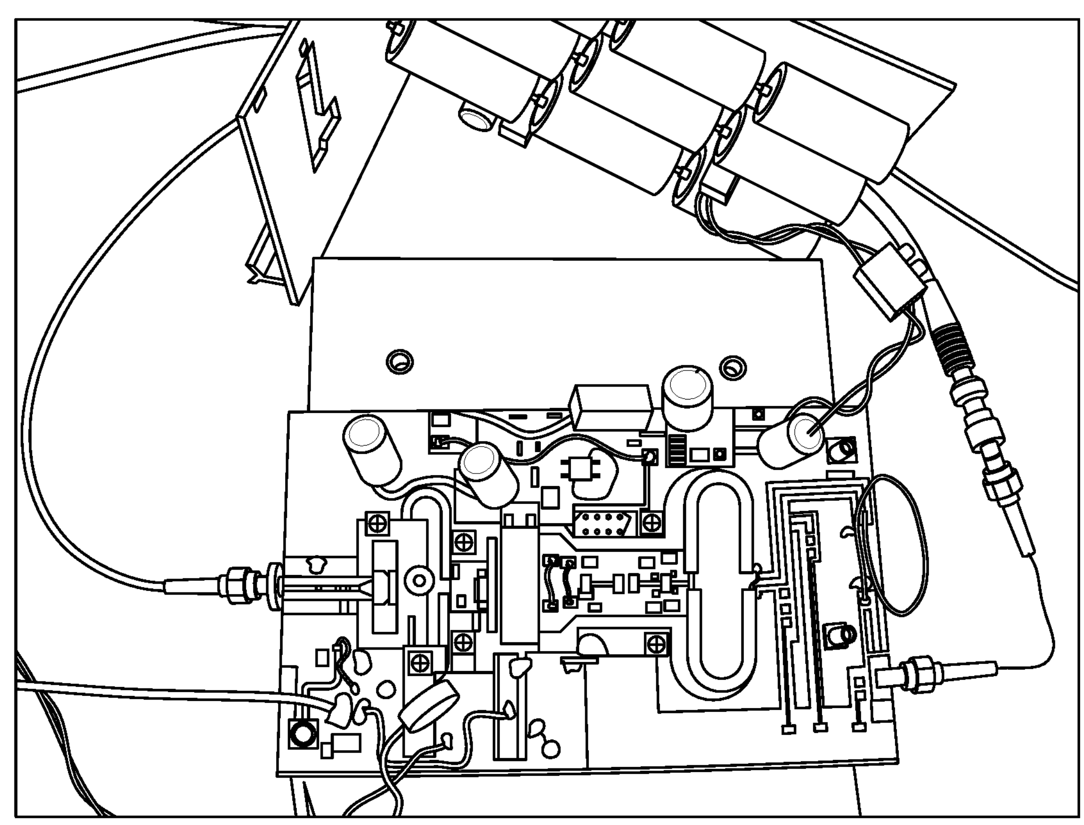

FIG. 8*a* depicts a power amplifier 802 setup used to validate the built-in coil current sensing methodology. The power amplifier 802 is configured to deliver a power output of 1 kW to a matched load. The printed circuit board depicts various electronic components including capacitors, inductors, and transmission lines, which are arranged to facilitate the specific requirements of RF signal amplification at high powers. The large capacitors indicate the high energy storage needed to sustain the 1 kW power delivery.

Figure 8B:
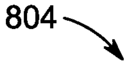
FIG. 8*b* depicts an RF coil 804 in proximity to a phantom, according to certain embodiments.
Figure 8B:
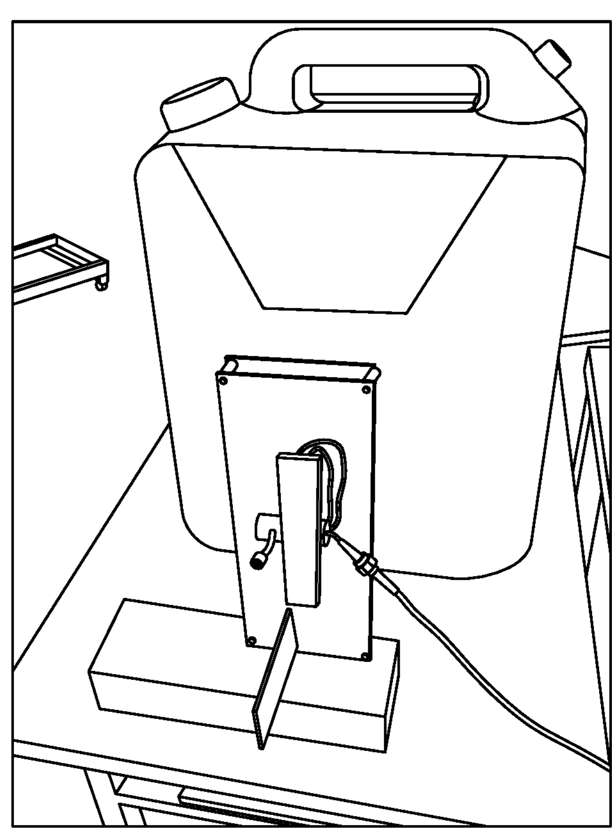

FIG. 8*b* depicts an RF coil 804 in proximity to a phantom, a common test object used in MRI to simulate the electrical properties of human tissue, in accordance with one embodiment. The RF coil 804, which is central to the functionality of MRI systems, is placed near this phantom to test its performance and the effectiveness of the current sensing at 1H resonant frequency (298 MHz). The setup is arranged to closely resemble real-world conditions under which the MRI system would operate.

Figure 9:
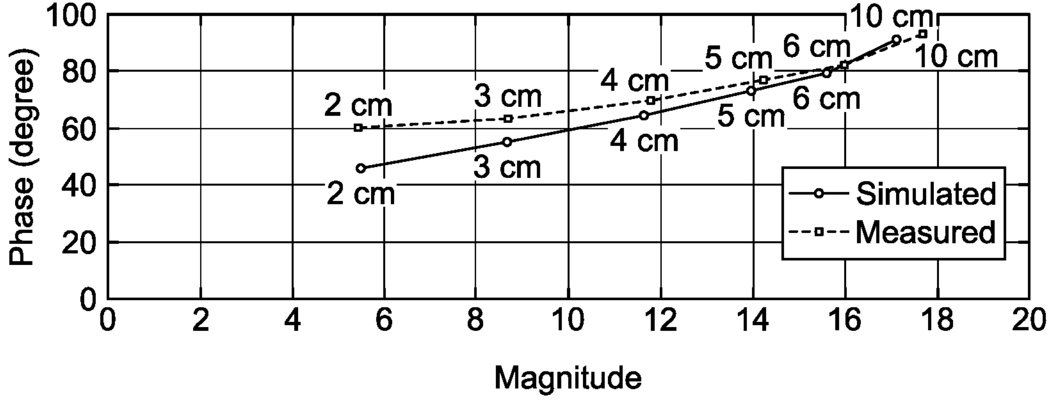
FIG. 9 presents a graph comparing the phase and magnitude of the currents, according to certain embodiments.

FIG. 9 presents a graph comparing the phase and magnitude of the currents, in accordance with one embodiment. Curve 902 represents the simulated current values, while curve 904 indicates the measured currents as the distance between the RF coil and the phantom changes. The graph demonstrates a strong correlation between the simulated and measured currents at larger distances. However, this correlation diminishes as the distance decreases, indicating the influence of proximity on the coil's sensing capability. This data is essential for understanding the behaviour of the RF coil in various operational scenarios and refining the current sensing technology for accurate MRI diagnostics.

Numerous modifications and variations of the present disclosure are possible in light of the above teachings. It is therefore to be understood that within the scope of the appended claims, the invention may be practiced otherwise than as specifically described herein.

The invention claimed is:

1. A current sensing system for a 1H/23Na magnetic resonance imaging (MRI) scanner, comprising:
- a coil network of a dual-tuned radiofrequency (RF) coil, comprising:
- up to two parallel transmission lines connected to a transmission antenna of the dual-tuned radiofrequency (RF) coil, wherein each of the up to two parallel transmission lines have a length of quarter-wavelength; and
- a pair of first shunt capacitors connected across the up to two parallel transmission lines, wherein each first shunt capacitor of the pair of first shunt capacitors is connected in series with a respective PIN diode;
- a transmission line segment, comprising:
- a first transmission line having a length of a multiple of half-wavelength; and
- a pair of second shunt capacitors connected across the first transmission line, wherein each second shunt capacitor of the pair of second shunt capacitors is connected in series with a respective PIN diode;
- a matching network coupled to a power amplifier, comprising:
- a second transmission line having a length of a quarter-wavelength; and
- a pair of third shunt capacitors connected across the second transmission line, wherein each third shunt capacitor of the pair of third shunt capacitors is connected in series with a respective PIN diode;
- wherein the respective length of the first transmission line and the second transmission line are configured to tune the current sensing system to a fundamental frequency and to a first odd multiple frequency of the fundamental frequency, wherein a 1H resonant frequency is the first odd multiple frequency of the fundamental frequency;
- wherein each of the pair of first shunt capacitors, the pair of second shunt capacitors and the pair of third shunt capacitors are configured to tune the current sensing system to a 23Na resonant frequency;
- wherein each of the respective PIN diodes of the pair of first shunt capacitors, the pair of second shunt capacitors and the pair of third shunt capacitors are configured to set the current sensing system to at least one of the 1H resonant frequency and the 23Na resonant frequency; and
- wherein the current sensing system tuned to at least one of the 1H resonant frequency and the 23Na resonant frequency is configured to sense a current of the dual-tuned radiofrequency (RF) coil at a respective tuned resonant frequency by sensing a voltage of the matching network coupled to the power amplifier.

2. The current sensing system of claim 1, wherein the transmission line segment comprises a plurality of transmission lines, each having a length of a multiple of double quarter-wavelength.

3. The current sensing system of claim 2, wherein the transmission line segment further comprises a pair of third shunt capacitors connected across each of the plurality of transmission lines resulting in a plurality of pairs of third shunt capacitors, wherein each third shunt capacitor of the plurality of pairs of third shunt capacitors is connected in series with a respective PIN diode.

4. The current sensing system of claim 1, wherein the transmission line segment is configured to apply a current forcing technique to the current sensing system.

5. The current sensing system of claim 1, wherein the power amplifier is configured to apply a cartesian feedback loop (FBL).

6. The current sensing system of claim 1, wherein a value of the first shunt capacitor is 27.2 pF, a value of the second shunt capacitor is 24.9 pF and a value of the third shunt capacitor is 13.66 pF.

7. The current sensing system of claim 1, wherein the fundamental frequency is 99.33 MHz.

8. The current sensing system of claim 1, wherein the 1H resonant frequency is 298 MHz and the 23Na resonant frequency is 78.8 MHz.

9. The current sensing system of claim 1, wherein the coil network is configured to match an input impedance of the dual-tuned radiofrequency (RF) coil to an impedance of the transmission line segment.

10. A current sensing system for a multi-tuned magnetic resonance imaging (MRI) scanner, comprising:
- a coil network of a multi-tuned radiofrequency (RF) coil, comprising:
- up to two parallel transmission lines connected to a transmission antenna of the multi-tuned radiofrequency (RF) coil, wherein each of the up to two parallel transmission lines have a length of quarter-wavelength; and
- a pair of first shunt capacitors connected across the up to two parallel transmission lines, wherein each first shunt capacitor of the pair of first shunt capacitors is connected in series with a respective PIN diode;

a transmission line segment, comprising:

a first transmission line having a length selected from a multiple of half-wavelength and a multiple of double quarter-wavelength; and a pair of second shunt capacitors connected across the first transmission line, wherein each second shunt capacitor of the pair of second shunt capacitors is connected in series with a respective PIN diode;

a matching network coupled to a power amplifier, comprising:

a second transmission line having a length of a quarter-wavelength; and a pair of third shunt capacitors connected across the second transmission line, wherein each third shunt capacitor of the pair of third shunt capacitors is connected in series with a respective PIN diode;

wherein the respective length of the first transmission line and the second transmission line in combination with each of the pair of first shunt capacitors, the pair of second shunt capacitors and the pair of third shunt capacitors are configured to tune the current sensing system to at least one of a 1H resonant frequency and a 23Na resonant frequency;

wherein each of the respective PIN diodes of the pair of first shunt capacitors, the pair of second shunt capacitors and the pair of third shunt capacitors are configured to set the current sensing system to at least one of the 1H resonant frequency and the 23Na resonant frequency; and wherein the current sensing system tuned to at least one of the 1H resonant frequency and the 23Na resonant frequency one or more resonant frequencies is configured to sense a current of the multi-tuned radiofrequency (RF) coil at a respective tuned resonant frequency by sensing a voltage of the matching network coupled to the power amplifier.

11. A method for sensing current of a radiofrequency (RF) coil of a dual-tuned magnetic resonance imaging (MRI) scanner, comprising:

connecting a coil network comprising up to two parallel transmission lines, each with a length of a quarter-wavelength to a transmission antenna of the radiofrequency (RF) coil;

connecting a matching network comprising a transmission line with a length of a quarter-wavelength to a power amplifier of the magnetic resonance imaging (MRI) scanner;

connecting the matching network and the coil network using a transmission line segment with a length of at least one of a multiple of half-wavelength and a multiple of double quarter-wavelength;

tuning the coil network, the matching network, and the transmission line segment to a first resonant frequency of the dual-tuned magnetic resonance imaging (MRI) scanner;

tuning the coil network, the matching network, and the transmission line segment to a second resonant frequency of the dual-tuned magnetic resonance imaging (MRI) scanner using three pairs of shunt capacitors with each pair of shunt capacitors connected across each of the coil network, the matching network, and the transmission line segment;

setting the coil network, the matching network, and the transmission line segment to at least one of the first resonant frequency and the second resonant frequency of the dual-tuned magnetic resonance imaging (MRI) scanner using six PIN diodes, wherein each of the six PIN diodes is connected in series to each of the shunt capacitor of the three pairs of shunt capacitors; and sensing a current of the radiofrequency (RF) coil of the dual-tuned magnetic resonance imaging (MRI) scanner tuned to at least one of the first resonant frequency or the second resonant frequency by measuring a voltage across the matching network connected to the power amplifier, wherein at least one of the first resonant frequency and the second resonant frequency is a 23Na resonant frequency.

12. The method of claim 11, further comprising tuning the coil network, the matching network, and the transmission line segment to a fundamental frequency of 99.33 MHz, wherein the first resonant frequency is an odd multiple of the fundamental frequency.

13. The method of claim 11, wherein the dual-tuned magnetic resonance imaging (MRI) scanner is a 1H/23Na magnetic resonance imaging (MRI) scanner.

14. The method of claim 11, wherein the first resonant frequency is a resonant frequency of 1H atomic nuclei (298 MHz) of the dual-tuned magnetic resonance imaging (MRI) scanner.

15. The method of claim 11, wherein the second resonant frequency is a resonant frequency of 23Na atomic nuclei (78.8 MHz) of the dual-tuned magnetic resonance imaging (MRI) scanner.

16. The method of claim 11, wherein the values of each pair of the three pairs of shunt capacitors is selected from 27.2 pF, 24.9 pF and 13.66 pF.

* * * * *